United States Patent [19]
Hong et al.

[11] Patent Number: 5,449,644
[45] Date of Patent: Sep. 12, 1995

[54] PROCESS FOR CONTACT HOLE FORMATION USING A SACRIFICIAL SOG LAYER

[75] Inventors: Gary Hong; Cheng H. Huang; Ming-Tzong Yang, all of Hsin Chu; Hong-Tsz Pan, Chang-hua, all of Taiwan

[73] Assignee: United Microelectronics Corporation, Hsinchu, Taiwan

[21] Appl. No.: 181,298

[22] Filed: Jan. 13, 1994

[51] Int. Cl.⁶ .......................................... H01L 21/302
[52] U.S. Cl. .................................. 437/225; 437/231; 148/DIG. 133
[58] Field of Search ................ 437/225, 231; 148/DIG. 133

[56] References Cited
U.S. PATENT DOCUMENTS

| | | | |
|---|---|---|---|
| 4,676,867 | 6/1987 | Elkins et al. | 156/643 |
| 4,775,550 | 10/1988 | Chu et al. | 427/38 |
| 4,920,072 | 4/1990 | Keller et al. | 437/192 |
| 5,003,062 | 3/1991 | Yen | 437/231 |
| 5,045,484 | 9/1991 | Yamada et al. | 437/31 |
| 5,068,207 | 11/1991 | Manocha et al. | 437/231 |
| 5,084,416 | 1/1992 | Ozaki et al. | 437/190 |
| 5,091,340 | 2/1992 | Mizushima | 437/194 |
| 5,169,801 | 12/1992 | Sato | 437/231 |
| 5,286,675 | 2/1994 | Chen et al. | 437/231 |
| 5,296,092 | 3/1994 | Kim | 156/643 |
| 5,324,689 | 6/1994 | Yoo | 437/231 |
| 5,350,486 | 9/1994 | Huang | 156/633 |

*Primary Examiner*—Brian E. Hearn
*Assistant Examiner*—Lynne A. Gurley
*Attorney, Agent, or Firm*—George O. Saile

[57] ABSTRACT

A new method of forming a contact opening by using a sacrificial spin-on-glass layer is described. A semiconductor substrate is provided wherein the surface of the substrate has an uneven topography. A glasseous layer is deposited over the uneven surface of the substrate and reflowed at low temperature whereby the glasseous layer will have a trench shaped surface over the planned contact opening area. The glasseous layer is covered with a spin-on-glass layer wherein the spin-on-glass planarizes the surface of the substrate. The spin-on-glass layer is baked and then covered with a uniform thickness layer of photoresist. The photoresist layer is exposed and developed to form the desired photoresist mask for the contact opening. The exposed spin-on-glass and glasseous layers are etched away to provide the contact opening to the semiconductor substrate. The photoresist layer is stripped and the sacrificial spin-on-glass layer is removed to complete the formation of the contact opening in the manufacture of the integrated circuit.

39 Claims, 2 Drawing Sheets

PROCESS FOR CONTACT HOLE FORMATION USING A SACRIFICIAL SOG LAYER

BACKGROUND OF THE INVENTION

1. Field of the Invention

The invention relates to a method of forming a contact opening, and more particularly, to a method of forming a contact opening through an uneven glasseous layer by using a sacrificial spin-on-glass layer in the manufacture of integrated circuits.

2. Description of the Prior Art

Referring to FIG. 1, there is shown a portion of a partially completed integrated circuit in which there is a silicon substrate 10. Semiconductor device regions 12 and 14 formed in and on the silicon substrate result in a uneven topography of the top surface of the substrate. A layer 16 of a glasseous material is deposited over the surface of the substrate. A layer of photoresist 20 coats the surface of the glasseous layer 16 and planarizes the substrate. The differing photoresist depths A and B will make it difficult for the photolithographic process. The smaller the geometry becomes, the smaller the depth of focus becomes. Thus, the greater the difference between A and B, the more difficult it is to resolve both A and B at the same time. The contact B would be unresolved.

U.S. Pat. Nos. 5,003,062 to Yen and 4,775,550 to Chu et al describe processes for planarization using spin-on-glass materials. These Patents are cited to show the general use of spin-on glass materials in the art.

SUMMARY OF THE INVENTION

A principal object of the present invention is to provide an effective and very manufacturable method of forming a contact opening through a smooth, but uneven dielectric layer.

Another object of the invention is to provide an effective and very manufacturable method of forming a contact opening through an uneven glasseous layer.

A further object of the present invention is to provide a method of forming a contact opening which will not require a complicated photolithographic process.

Yet another object is to provide a method of forming a contact opening which does not require the use of both a wet and a dry etching process.

In accordance with the objects of this invention a new method of forming a contact opening by using a sacrificial spin-on-glass layer is achieved. A semiconductor substrate is provided wherein the surface of the substrate has an uneven topography. A glasseous layer is deposited over the uneven surface of the substrate and reflowed at low temperature whereby the glasseous layer will have a trench shaped surface over the planned contact opening area. The glasseous layer is covered with a spin-on-glass layer wherein the spin-on-glass planarizes the surface of the substrate. The spin-on-glass layer is baked and then covered with a uniform thickness layer of photoresist. The photoresist layer is exposed and developed to form the desired photoresist mask for the contact opening. The exposed spin-on-glass and glasseous layers are etched away to provide the contact opening to the semiconductor substrate. The photoresist layer is stripped and the sacrificial spin-on-glass layer is removed to complete the formation of the contact opening in the manufacture of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 2:
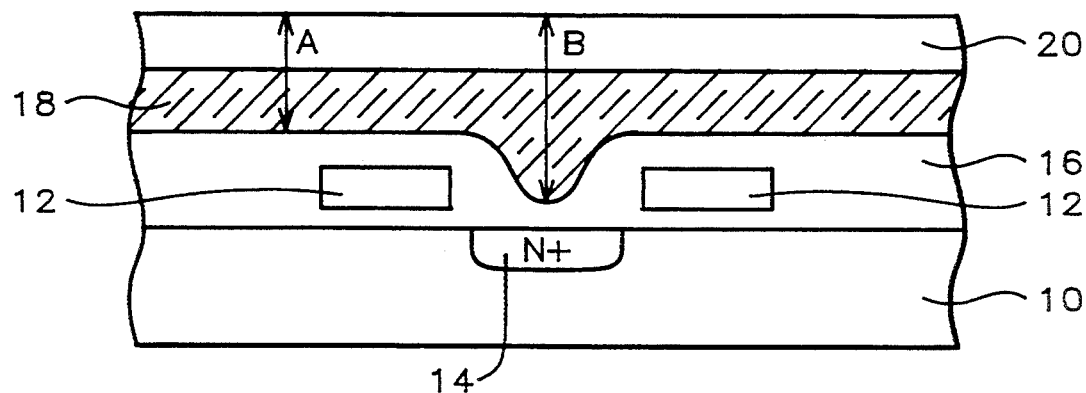
FIGS. 2 through 5 schematically illustrate in cross-sectional representation one preferred embodiment of the present invention.

Referring now more particularly to FIG. 2, the process of the present invention will be described. A portion of a partially completed integrated circuit is illustrated in FIG. 2 consisting of a semiconductor substrate 10, preferably composed of monocrystalline silicon. Semiconductor device structures have been formed as is conventional in the art in and on the semiconductor substrate 10 resulting in an uneven topography of the surface of the substrate. For example, gate electrodes 12 and source/drain region 14 are illustrated in FIG. 2. A glasseous material 16 is deposited over the semiconductor device structures over the surface of the semiconductor substrate. This glasseous material may be phosphosilicate glass (PSG), borophosphosilicate glass (BPSG) or a combination of tetraethylorthosilicate (TEOS) and BPSG and is deposited to a depth of between about 3000 to 9000 Angstroms. A non-glasseous dielectric layer may be used with this invention so long as the layer is smooth although uneven. Such dielectric materials may be ECR chemically vapor deposited (CVD) oxide, thermal TEOS, and $O_3$-TEOS.

The glasseous layer 16 is reflowed at a very low temperature of less than about 850° C. The smaller the device, the smaller the thermal budget, so a high temperature reflow is undesirable. This low temperature reflow of the glasseous layer results in the densification of the layer.

Figure 1:
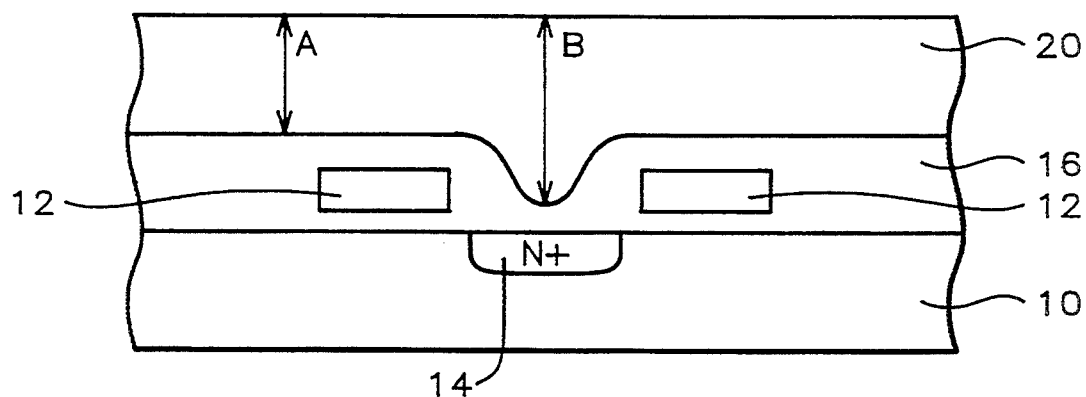
FIG. 1 schematically illustrates in cross-sectional representation the conventional Prior Art process.

The layer 16 has a trench shape over the planned contact opening between two device regions. If a photoresist layer were to be deposited over this uneven glasseous or nonglasseous layer, the depth of the photoresist layer would not be constant. As shown in FIG. 1, the depth B over the planned contact region would be much greater than depth A over a device region.

A spin-on-glass material 18, either a silicate or a siloxane, is deposited over the dielectric layer 16 to a thickness of between about 1000 to 5000 Angstroms. The spin-on-glass material suspended in the vehicle or solvent is deposited onto the semiconductor wafer surface and uniformly spread thereover by the action of spinning the wafer, for example, at 3500 revolutions per minute. The spin-on-glass material fills in the indentations and smooths the integrated circuit wafer surface. The spin-on-glass material is now baked at a temperature of between about 50° to 200° C. to remove the solvent and fix the layer. The spin-on-glass may be cured, but preferably is not cured because of the cost issue.

The photoresist layer 20 is deposited over the planarized surface of the wafer thus allowing a uniform thickness of the photoresist layer. The differing thicknesses A and B are within the spin-on-glass coating rather than within the photoresist as in the prior art (FIG. 1). The photolithographic process is much more difficult when more than one focusing depth is required. Using the process of the present invention, only one focusing depth is required.

Figure 3:
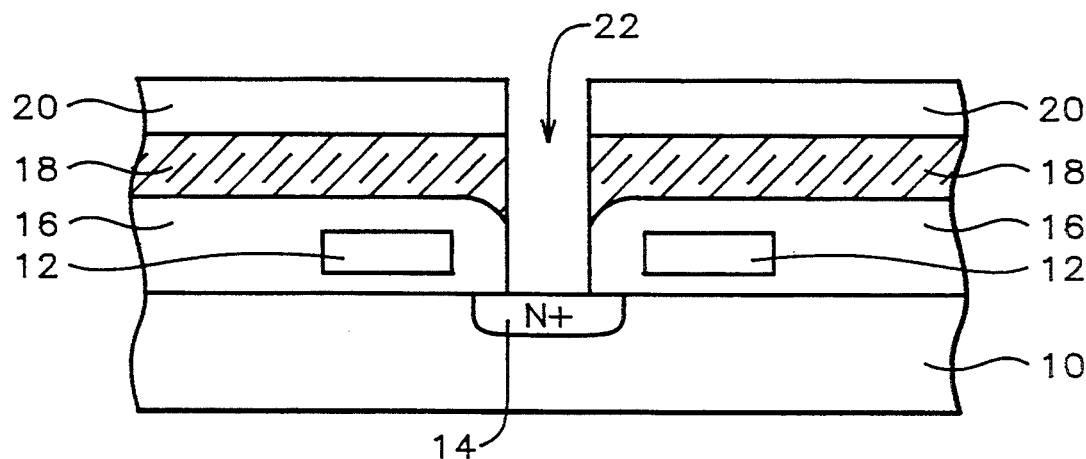

Referring now to FIG. 3, the photoresist layer is exposed and developed over the planned contact opening. The spin-on-glass and dielectric layers, 18 and 16, are etched using $CF_4$ and $H_2$ or $CHF_3$ reactive ion etching resulting in contact opening 22. Typically, both a wet and a dry etch are used. This full dry etch is a key advantage for cost savings.

Figure 4:
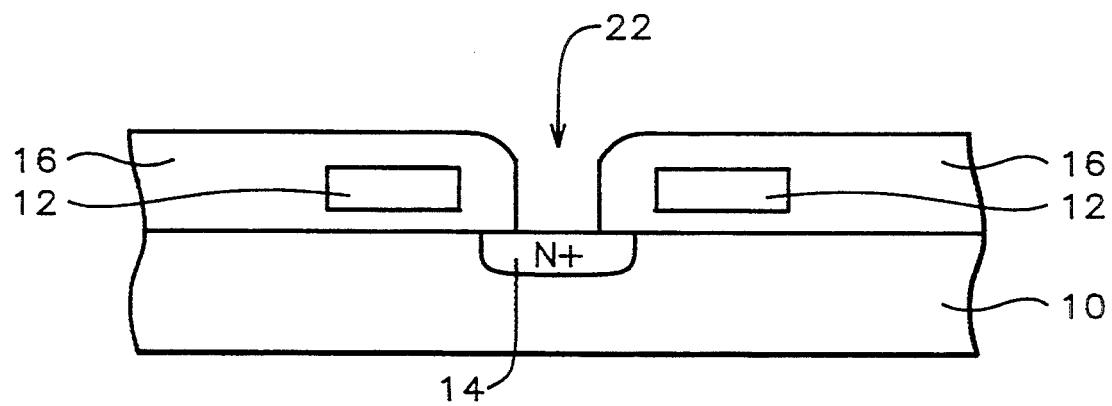

The photoresist mask is stripped using an $O_2$ plasma and the following $H_2SO_4$ and $H_2O_2$ clean. The sacrificial spin-on-glass layer 18 is removed using a buffered oxide etch (BOE) wherein the selectivity of spin-on-glass to BPSG is 20:1. FIG. 4 illustrates the completed contact opening 22. Since all of the spin-on-glass layer has been removed, the step height of the contact opening has not been increased.

Figure 5:
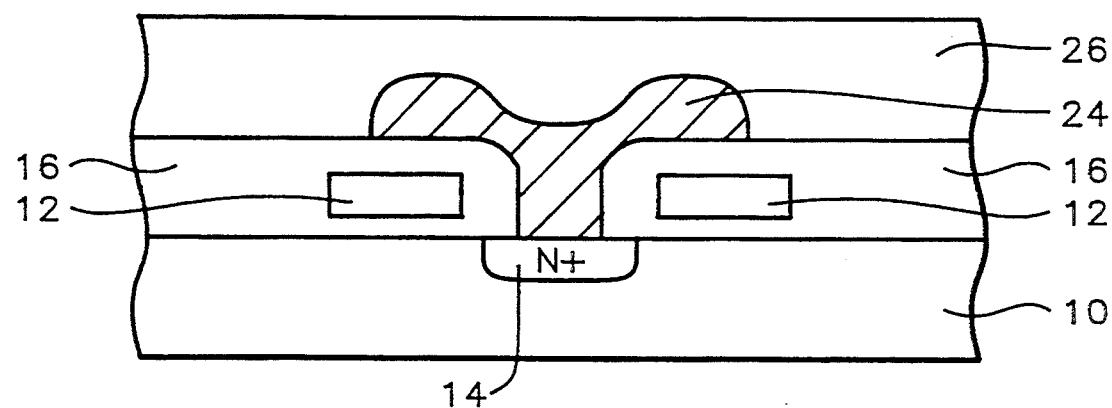

Referring now to FIG. 5, there is shown a conducting layer 24 filling the contact opening. The conducting layer is patterned and a passivation layer 26 is deposited over the surface of the substrate to complete fabrication of the integrated circuit.

The process of the present invention results in a contact opening formed by a simple photolithographic process using a full dry etch. The spin-on-glass material used to planarize the layer under the photoresist is easy to apply by spinning and easy to remove.

While the invention has been particularly shown and described with reference to the preferred embodiments thereof, it will be understood by those skilled in the art that various changes in form and details may be made without departing from the spirit and scope of the invention.

What is claimed is:

1. The method of forming a contact opening using a sacrificial spin-on-glass layer in the fabrication of an integrated circuit comprising:

providing semiconductor device structures in and on a semiconductor substrate wherein the surface of said substrate has an uneven topography;

depositing a glasseous layer over said uneven surface of said substrate and reflowing said glasseous layer whereby said glasseous layer will have a trench shaped surface over planned said contact opening area;

covering said glasseous layer with a sacrificial spin-on-glass layer wherein said sacrificial spin-on-glass planarizes the surface of said substrate and baking said sacrificial spin-on-glass layer;

covering said sacrificial spin-on-glass layer with a uniform thickness layer of photoresist;

exposing and developing said photoresist layer to form the desired photoresist mask for said contact opening;

etching said exposed sacrificial spin-on-glass and glasseous layers to provide said contact opening to said semiconductor substrate;

stripping said photoresist layer; and removing said sacrificial spin-on-glass layer to complete said contact opening in the manufacture of said integrated before forming subsequent metallization within said contact opening circuit.

2. The method of claim 1 wherein said glasseous layer is composed of borophosphosilicate glass with a thickness of between about 3000 to 9000 Angstroms.

3. The method of claim 1 wherein said glasseous layer is composed of phosphosilicate glass with a thickness of between about 3000 to 9000 Angstroms.

4. The method of claim 1 wherein said glasseous layer is composed of tetraethylorthosilicate and borophosphosilicate glass with a thickness of between about 3000 to 9000 Angstroms.

5. The method of claim 1 wherein said reflow is at less than about 850° C. and wherein said fellow serves to densify said glasseous layer.

6. The method of claim 1 wherein said spin-on-glass material is siloxane.

7. The method of claim 1 wherein said spin-on-glass material is a silicate.

8. The method of claim 1 wherein said spin-on-glass layer has a thickness of between about 1000 to 5000 Angstroms.

9. The method of claim 1 wherein said spin-on-glass layer is baked at between about 50° to 200° C.

10. The method of claim 1 wherein said etching of said exposed spin-on-glass and said glasseous layer is a reactive ion etch.

11. The method of claim 1 wherein said spin-on-glass layer is removed by a buffered oxide etch.

12. The method of forming a contact opening using a sacrificial spin-on-glass layer in the fabrication of an integrated circuit comprising:

providing semiconductor device structures in and on a semiconductor substrate wherein the surface of said substrate has an uneven topography;

depositing an insulating layer over said uneven surface of said substrate whereby said insulating layer will have a trench shaped surface over planned said contact opening area;

covering said insulating layer with a sacrificial spin-on-glass layer wherein said sacrificial spin-on-glass planarizes the surface of said substrate and baking said sacrificial spin-on-glass layer;

covering said sacrificial spin-on-glass layer with a uniform thickness layer of photoresist;

exposing and developing said photoresist layer to form the desired photoresist mask for said contact opening;

etching said exposed sacrificial spin-on-glass and insulating layers to provide said contact opening to said semiconductor substrate;

stripping said photoresist layer; and removing said sacrificial spin-on-glass layer to complete said contact opening in the manufacture of said integrated before forming subsequent metallization within said contact opening circuit.

13. The method of claim 12 wherein said insulating layer is composed of borophosphosilicate glass with a thickness of between about 3000 to 9000 Angstroms.

14. The method of claim 13 wherein said borophosphosilicate glass layer is reflowed at a temperature of less than about 850° C. and wherein said reflow serves to densify said borophosphosilicate glass layer.

15. The method of claim 12 wherein said insulating layer is composed of phosphosilicate glass with a thickness of between about 3000 to 9000 Angstroms.

16. The method of claim 15 wherein said phosphosilicate glass layer is reflowed at a temperature of less than about 850° C. and wherein said reflow serves to densify said phosphosilicate glass layer.

17. The method of claim 12 wherein said insulating layer is composed of thermal tetraethoxysilane with a thickness of between about 3000 to 9000 Angstroms.

18. The method of claim 12 wherein said insulating layer is composed of $O_3$ —tetraethoxysilane with a thickness of between about 3000 to 9000 Angstroms.

19. The method of claim 12 wherein said insulating layer is composed of ECR chemically vapor deposited oxide with a thickness of between about 3000 to 9000 Angstroms.

20. The method of claim 12 wherein said insulating layer is composed of tetraethylorthosilicate-borophosphosilicate glass with a thickness of between about 3000 to 9000 Angstroms.

21. The method of claim 12 wherein said spin-on-glass material is siloxane.

22. The method of claim 12 wherein said spin-on-glass material is a silicate.

23. The method of claim 12 wherein said spin-on-glass layer has a thickness of between about 1000 to 5000 Angstroms.

24. The method of claim 12 wherein said spin-on-glass layer is baked at between about 50° to 200° C.

25. The method of claim 12 wherein said etching of said exposed spin-on-glass and said insulating layer is a reactive ion etch.

26. The method of claim 12 wherein said spin-on-glass layer is removed by a buffered oxide etch.

27. The method of forming a contact using a sacrificial spin-on-glass layer in the fabrication of an integrated circuit comprising:

providing semiconductor device structures in and on a semiconductor substrate wherein said semiconductor device structures include at least two gate electrodes on the surface of said semiconductor substrate and source/drain regions within said semiconductor substrate and wherein the surface of said substrate has an uneven topography;

depositing an insulating layer over said uneven surface of said substrate whereby said insulating layer will have a trench shaped surface over planned said contact area between two said gate electrodes;

covering said insulating layer with a sacrificial spin-on-glass layer wherein said sacrificial spin-on-glass planarizes the surface of said substrate and baking said sacrificial spin-on-glass layer;

covering said spin-on-glass layer with a uniform thickness layer of photoresist;

exposing and developing said photoresist layer to form the desired photoresist mask for said contact;

etching said exposed sacrificial spin-on-glass and insulating layers to provide an opening for said contact to said source/drain region within said semiconductor substrate;

stripping said photoresist layer;

removing said sacrificial spin-on-glass layer;

thereafter filling said contact opening with a conducting layer and patterning said conducting layer; and depositing a passivation layer overlying said conducting layer to complete said contact in the manufacture of said integrated circuit.

28. The method of claim 27 wherein said insulating layer is composed of borophosphosilicate glass with a thickness of between about 3000 to 9000 Angstroms.

29. The method of claim 28 wherein said borophosphosilicate glass layer is reflowed at a low temperature of less than about 850° C. and wherein said reflow serves to densify said borophosphosilicate glass layer.

30. The method of claim 27 wherein said insulating layer is composed of phosphosilicate glass with a thickness of between about 3000 to 9000 Angstroms.

31. The method of claim 27 wherein said phosphosilicate glass layer is reflowed at a temperature of less than about 850° C. and wherein said reflow serves to densify said phosphosilicate glass layer.

32. The method of claim 27 wherein said insulating layer is composed of thermal tetraethoxysilane with a thickness of between about 3000 to 9000 Angstroms.

33. The method of claim 27 wherein said insulating layer is composed of $O_3$—tetraethoxysilane with a thickness of between about 3000 to 9000 Angstroms.

34. The method of claim 27 wherein said insulating layer is composed of ECR chemically vapor deposited oxide with a thickness of between about 3000 to 9000 Angstroms.

35. The method of claim 27 wherein said insulating layer is composed of tetraethylorthosilicate borophosphosilicate glass with a thickness of between about 3000 to 9000 Angstroms.

36. The method of claim 27 wherein said spin-on-glass layer has a thickness of between about 1000 to 5000 Angstroms.

37. The method of claim 27 wherein said spin-on-glass layer is baked at between about 50° to 200° C.

38. The method of claim 27 wherein said etching of said exposed spin-on-glass and said insulating layer is a reactive ion etch.

39. The method of claim 27 wherein said spin-on-glass layer is removed by a buffered oxide etch.

* * * * *